United States Patent
Iwai et al.

(10) Patent No.: US 11,967,458 B2
(45) Date of Patent: Apr. 23, 2024

(54) SUPERCONDUCTING COIL AND SUPERCONDUCTING COIL DEVICE

(71) Applicants: KABUSHIKI KAISHA TOSHIBA, Tokyo (JP); Toshiba Energy Systems & Solutions Corporation, Kawasaki (JP)

(72) Inventors: Sadanori Iwai, Kawasaki (JP); Taizo Tosaka, Yokohama (JP); Hiroshi Miyazaki, Yokohama (JP); Kenji Tasaki, Nakano (JP)

(73) Assignees: KABUSHIKI KAISHA TOSHIBA, Tokyo (JP); Toshiba Energy Systems & Solutions Corporation, Kawasaki (JP)

(*) Notice: Subject to any disclaimer, the term of this patent is extended or adjusted under 35 U.S.C. 154(b) by 0 days.

(21) Appl. No.: 18/344,993

(22) Filed: Jun. 30, 2023

(65) Prior Publication Data
US 2023/0368953 A1 Nov. 16, 2023

Related U.S. Application Data

(62) Division of application No. 15/780,470, filed as application No. PCT/JP2016/075658 on Sep. 1, 2016.

(30) Foreign Application Priority Data

Dec. 2, 2015 (JP) .................. 2015-235626

(51) Int. Cl.
| | | |
|---|---|---|
| *H01F 6/02* | (2006.01) | |
| *H01B 12/02* | (2006.01) | |
| *H01F 6/06* | (2006.01) | |
| *H02K 3/02* | (2006.01) | |
| *H02K 55/00* | (2006.01) | |
| *H10N 60/20* | (2023.01) | |
| *H10N 60/85* | (2023.01) | |

(52) U.S. Cl.
CPC ............ *H01F 6/02* (2013.01); *H01B 12/02* (2013.01); *H01F 6/06* (2013.01); *H02K 3/02* (2013.01); *H02K 55/00* (2013.01); *H10N 60/203* (2023.02); *H10N 60/85* (2023.02)

(58) Field of Classification Search
CPC ..................................... H01F 6/02; H01F 6/06
See application file for complete search history.

(56) References Cited

U.S. PATENT DOCUMENTS

| | | |
|---|---|---|
| 2,761,849 A | 9/1956 | Coler |
| 5,209,873 A | 5/1993 | Yamamoto et al. |
| 2011/0218111 A1 | 9/2011 | Ichiki et al. |

FOREIGN PATENT DOCUMENTS

| | | |
|---|---|---|
| EP | 0312741 A2 | 4/1989 |
| JP | 1-118409 A | 5/1989 |

(Continued)

OTHER PUBLICATIONS

International Search Report dated Nov. 15, 2016, in PCT/JP2016/075658, filed on Sep. 1, 2016.

*Primary Examiner* — Ramon M Barrera
(74) *Attorney, Agent, or Firm* — Maier & Maier, PLLC

(57) ABSTRACT

A superconducting coil includes: a winding member 12 that has a side surface 18 along a coil radial direction and is formed by laminating a superconducting tape wire 20 in the coil radial direction by winding; and a bypass 19 that is provided on the side surface 18 of the winding member 12 and electrically connects the superconducting tape wire 20 in the coil radial direction.

12 Claims, 16 Drawing Sheets

(56) References Cited

FOREIGN PATENT DOCUMENTS

| | | |
|---|---|---|
| JP | 04032207 A | 2/1992 |
| JP | 09279063 A | 10/1997 |
| JP | 2001093721 A | 4/2001 |
| JP | 2010067908 A | 3/2010 |
| JP | 2010219226 A | 9/2010 |
| JP | 2010267835 A | 11/2010 |
| JP | 2011187524 A | 9/2011 |
| JP | 5259487 B2 | 8/2013 |
| JP | 2014022693 A | 2/2014 |
| WO | 2017061563 A1 | 4/2017 | ns
SUPERCONDUCTING COIL AND SUPERCONDUCTING COIL DEVICE

CROSS-REFERENCE TO RELATED APPLICATIONS

This application is a divisional of U.S. application Ser. No. 15/780,470, filed on May 31, 2018, which is a National Stage of international Application No. PCT/JP2016/075658, filed on Sep. 1, 2016, and based upon and claims the benefit of priority from Japanese Patent Application No. 2015-235626, filed on Dec. 2, 2015, the entire contents of each of which are incorporated herein by reference.

FIELD

The present invention relates to technology for preventing quenching or thermal runaway of a superconducting coil device.

BACKGROUND

A superconducting wire has a specific range of keeping its superconducting state in terms of current density, temperature, and magnetic field. In other words, a superconducting wire has critical current density, critical temperature, and critical magnetic field.

Thus, even when the superconducting state is established and the electric resistance becomes almost zero, it is impossible to cause electric current to infinitely flow through the superconducting wire.

When any of current density, temperature, and magnetic field exceeds the critical value, the superconducting wire transitions to the normal conductive state.

The joule heat of a normal conductive part due to normal conductive transition may cause thermal runaway of burning the superconducting wire or quench that instantaneously generates a large amount of heat.

Thus, in the superconducting coil, protection against the normal conductive transition from the superconducting phase is required.

For instance, there is a known method in which a protective resistor is connected in parallel to a superconducting coil to shut off the excitation power supply in response to a trigger, i.e., in response to a rise in coil voltage or coil temperature due to transition to the normal conductive state.

After shutting off the excitation power supply, it becomes a closed circuit composed of only the superconducting coil and the protective resistance and thus the electric current flowing through the coil can be attenuated.

However, the above-described conventional technology has a problem that a blocking mechanism for interrupting the excitation power supply is required separately for suppressing the occurrence of thermal runaway or quench.

This blocking mechanism causes the superconducting coil device to become large and complicated.

PRIOR ART DOCUMENT

Patent Document

[Patent Document 1] Japanese Unexamined Patent Application Publication No. 2009-164167
[Patent Document 2] Japanese Unexamined Patent Application Publication No. 2010-267835

SUMMARY OF THE INVENTION

In view of the above-described problem, an object of the present invention is to provide a superconducting coil and a superconducting coil device, each of which can suppress the occurrence of thermal runaway or quench.

A superconducting coil according to the present embodiment includes: a winding member that has a side surface along a coil radial direction and is formed by laminating a superconducting tape wire in the coil radial direction by winding; and a bypass that is provided on at least a part of the side surface of the winding member and electrically connects the superconducting tape wire in the coil radial direction.

DESCRIPTION OF EMBODIMENTS

Hereinafter, embodiments of the present invention will be described with reference to the accompanying drawings.

Although superconducting coils and superconducting coil devices of the embodiments described below exhibit effects in both of a high temperature superconducting wire and a low temperature superconducting wire, in the following, a description will be given of high-temperature superconducting wires that exhibit particularly high effects.

First Embodiment

First, a configuration of a general pattern of high-temperature superconducting wire 20 will be described with reference to FIG. 1 that is a perspective view of the high-temperature superconducting wire 20.

Figure 1:
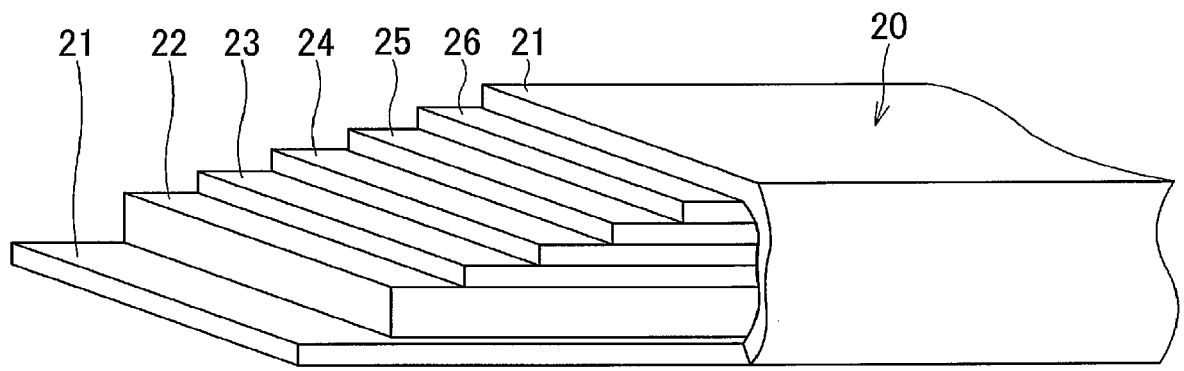
FIG. 1 is a perspective view illustrating a configuration of a general high-temperature superconducting wire.

As shown in FIG. 1, the high-temperature superconducting wire 20 constitutes a tape-shaped thin-film wire 20 in which thin film layers are laminated, in general.

This thin-film wire 20 is a wire material such as a REBCO wire that includes a high-temperature superconducting layer 25 (hereinafter, referred to as the superconducting layer 25) made of, e.g., rare metal oxide (RE oxide).

The thin-film wire 20 includes, e.g., a stabilizing layer 21, a substrate 22, an orientation layer 23, an intermediate layer 24 formed on the substrate 22, a superconducting layer 25, and a protective layer 26. The substrate 22 is a high-strength metal material such as a nickel-base alloy, stainless steel, or copper. The orientation layer 23 is made of, e.g., magnesium for orienting the intermediate layer 24 on the surface of the substrate 22. The superconducting layer 25 is formed on the intermediate layer 24 and is made of an oxide. The protective layer 26 is made of metal, e.g., silver, gold, platinum. The stabilizing layer 21 is a highly conductive metal such as copper or aluminum.

The intermediate layer 24 prevents thermal distortion attributable to the thermal contraction of the substrate 22 and the superconducting layer 25.

The protective layer 26 protects the superconducting layer 25 by preventing oxygen contained in the superconducting layer 25 from diffusing from the superconducting layer 25.

The stabilizing layer 21 serves as a detouring path of an excessive energizing current to the superconducting layer 25 so as to prevent thermal runaway.

However, the type and the number of each layer constituting the thin-film wire 20 is not limited to the above aspect, and may be larger or smaller as necessary.

Figure 2:
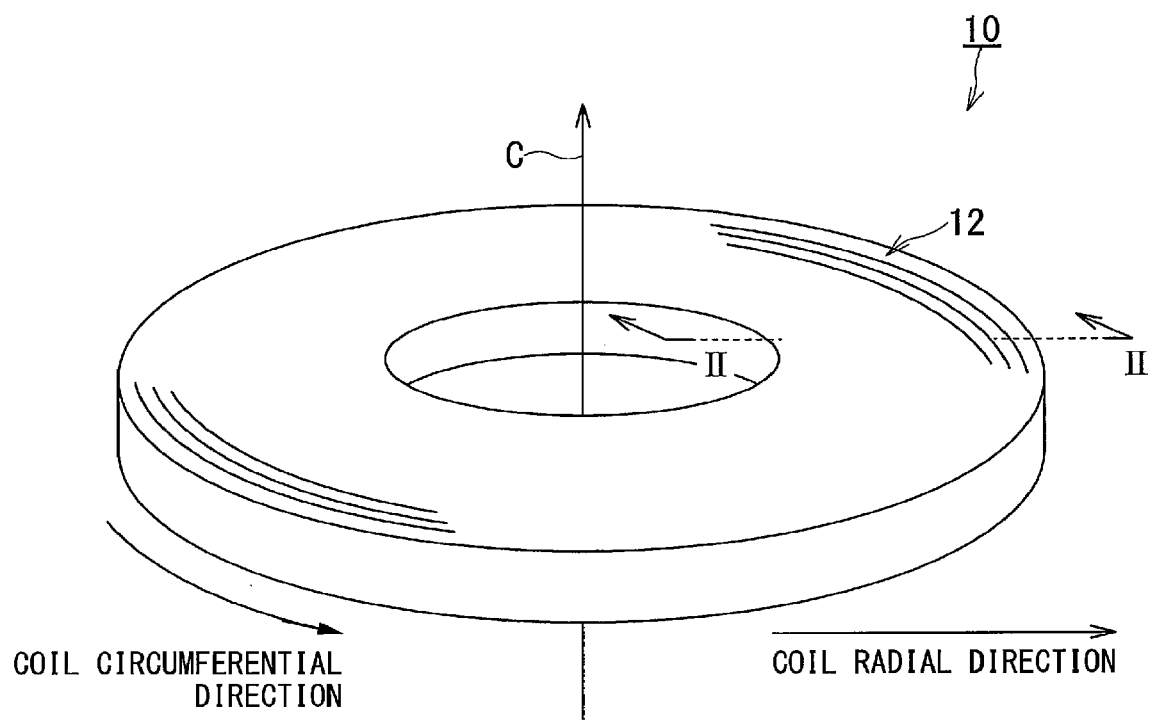
FIG. 2 is a schematic perspective view illustrating a superconducting coil configured of a winding member that is formed by winding a high-temperature superconducting wire.

FIG. 2 is a schematic perspective view illustrating the superconducting coil 10 configured of a winding member 12 that is formed by winding the thin-film wire 20.

As shown in FIG. 2, for instance, the thin film wire 20 is wound in a concentric circular pancake shape around the winding center C so as to form the winding member 12.

The winding member 12 is wound around a non-illustrated winding frame 14 so as to constitute a superconducting coil 10.

Figure 3:
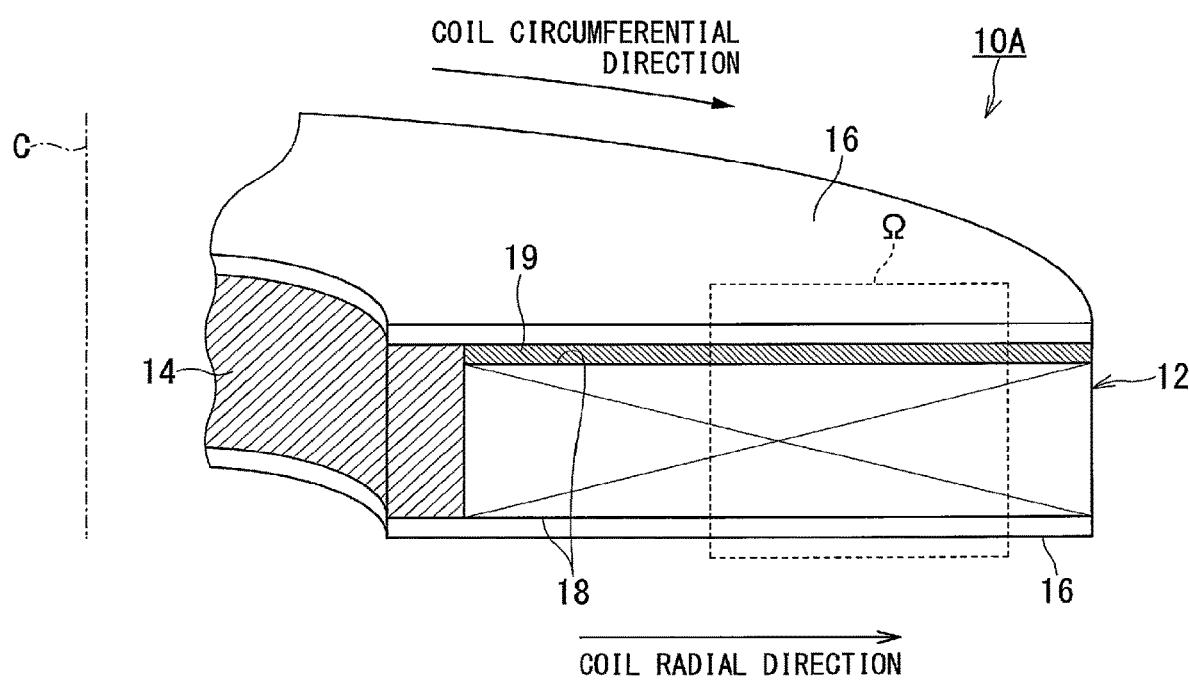
FIG. 3 is a cross-sectional view in the coil radial direction taken along the line II-II of FIG. 2 for illustrating the superconducting coil according to the first embodiment.

FIG. 3 is a cross-sectional view in the coil radial direction taken along the line II-II of FIG. 2 for illustrating the superconducting coil 10 of the first embodiment.

Figure 4:
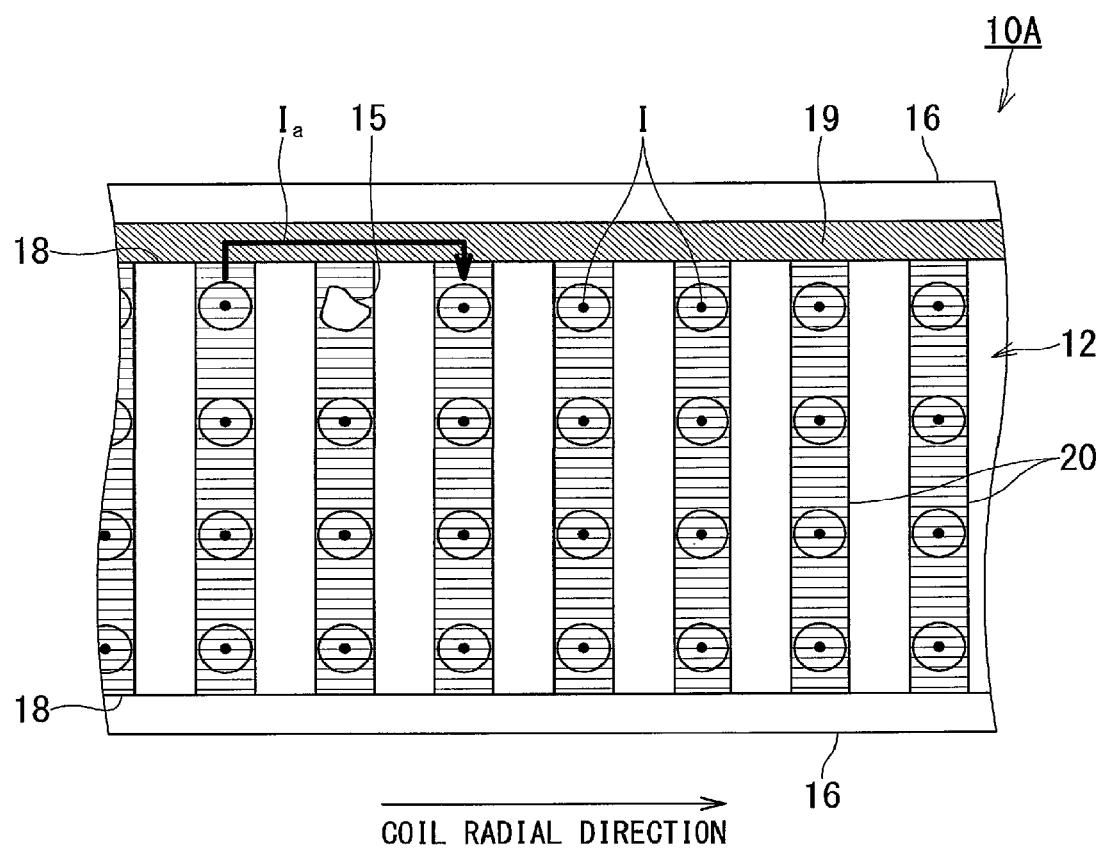
FIG. 4 is an enlarged cross-sectional view of the Q portion of FIG. 3.

FIG. 4 is an enlarged cross-sectional view of the Q portion in FIG. 3.

In general, the winding member 12 is formed by being wound around the winding frame 14, and then is impregnated with an insulating material 16 such as epoxy resin together with the winding frame 14.

The insulating material 16 is filled in each gap (wire gap) between the facing surfaces of the thin-film wire 20 wound around the winding frame 14, and the winding member 12 is coated with the insulating material 16.

When an insulating material having adhesiveness such as epoxy resin is used for the insulating material 16, the gap between the facing surfaces of adjacent turns in the thin-film wire 20 are insulated from each other, adhered to each other, and integrally formed.

Depending on a manufacturing method, the thin-film wire 20 may be adhered as needed while being wound.

Further, the insulating material 16 includes two types, i.e., a type to be filled in the wire gap and the other type to be coated on the entirety of the wire member 12, and may be separately formed.

The insulating material 16 formed in the wire gap may be a tape wire of an insulating material.

Figure 5:
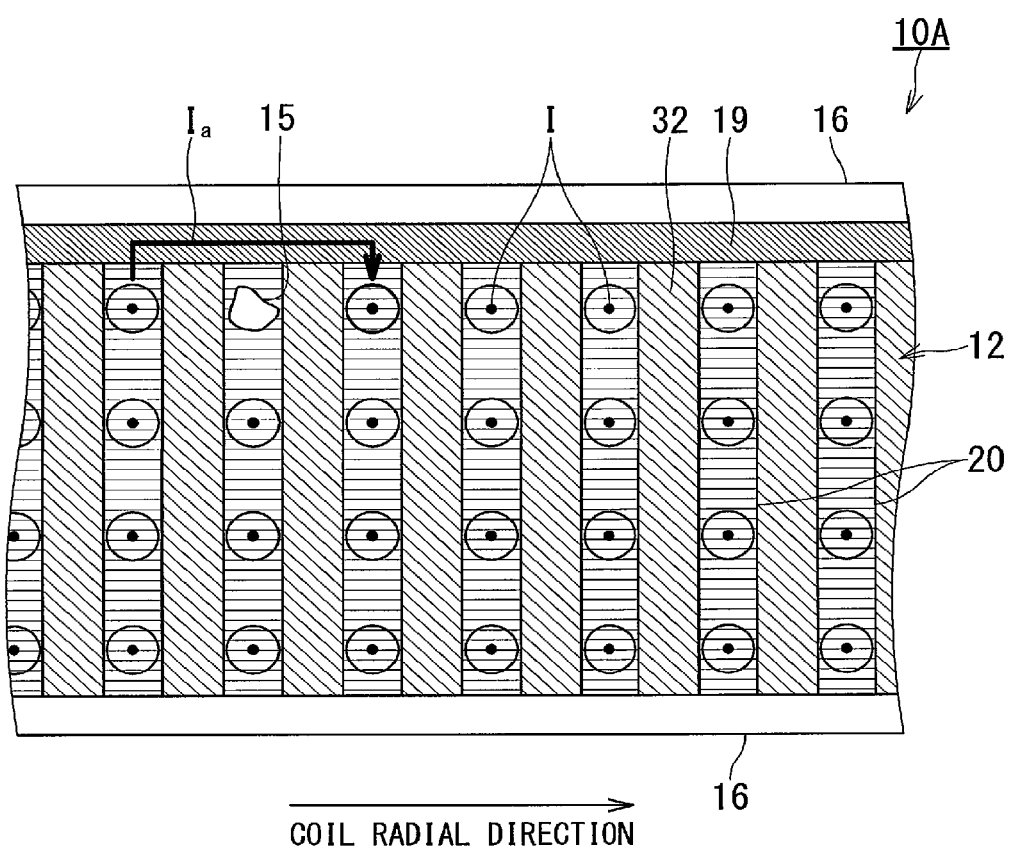
FIG. 5 is an enlarged cross-sectional view in the coil radial direction for illustrating the superconducting coil according to the first modification of the first embodiment.

FIG. 5 is an enlarged cross-sectional view in the coil radial direction for illustrating a superconducting coil 10A according to the first modification of the first embodiment.

As shown in FIG. 5, in the thin-film wire 20, a normal conductive metal 32 may be disposed in a part of the wire gap without insulating its adjacent turns by the insulating material 16.

Additionally, other adjacent turns of the thin-film wire 20 may be placed in direct contact with each other.

In the case of disposing the normal conductive metal 32, when a normal conductive spot 15 is generated due to the local normal conductive transition of the thin-film wire 20, a partial current $I_a$ of the energizing current I flowing in the coil circumferential direction flows across the normal conducting metal 32 toward another adjacent turn of the thin-film wire 20 in the coil radial direction.

As shown in FIG. 3 and FIG. 4, the superconducting coil 10A according to the first embodiment includes a bypass 19 that is provided on a side surface 18 of the winding member 12 and electrically connects the thin-film wire 20 in the coil radial direction.

The wire member 12 has side surfaces 18 along the coil radial direction, and the side surfaces 18 are formed by winding the thin-film wire 20 such that the thin-film wire 20 is laminated in the coil radial direction.

The bypass 19 electrically connects other turns of the thin-film wire 20 on the side surface 18.

A material selected for the bypass 19 is a material that is larger in resistance than the superconducting coil 10A at the time of normal operation and smaller in resistance than the superconducting coil 10A at the time of the normal conductive transition. The material which may be selected for the bypass 19 is, e.g., a semiconductor, a ceramics material, a superconducting material, or a normal conductor such as stainless steel, aluminum, and indium.

These materials are made into a plate or foil and electrically connected to the wire member 12 by pressure bonding or soldering.

In addition, one of the side surfaces 18 of the thin-film wire 20 may be plated or coated with the material for the bypass 19 so that the bypass 19 is formed, for instance.

In particular, when the bypass 19 is formed by plating, the bypass 19 can be thinned and the free deformation of the superconducting coil 10A is not inhibited.

Although the bypass 19 is provided only on one of the side surfaces 18 of the wire member 12 in FIG. 3 and FIG. 4, respective two bypasses 19 may be provided on both side surfaces.

An external magnetic field gradually penetrates into the thin-film wire 20 as the emerging current approaches the critical current that is the limit of the energizing current. Thereby, in the thin-film wire 20, the portion where the superconducting state locally breaks down is transferred to the normal conductive state.

The flux flow resistance associated with this local normal conductive transition induces heat due to joule loss. Thus, when this flux flow resistance increases due to increase physical quantity such as temperature in the coil, it induces thermal runaway or quench.

When a local flux flow resistance due to normal conductive transition occurs in a part of the thin-film wire 20, by providing the bypass 19, a partial current $I_a$ of the energizing current I flowing in the coil circumferential direction can detour to another adjacent turn of the thin-film wire 20 via the bypass 19 in the coil radial direction.

The energizing current flowing in the coil circumferential direction decreases from I to I-$I_a$. In this case, when $R_a$ is defined as the resistance of the bypass 19 and R is defined as the flux flow resistance, the current $I_a$ detouring in the coil radial direction is proportional to $R/(R+R_a)$.

Thus, as the flux flow resistance increases, more energizing current will detour in the coil radial direction.

Accordingly, it is possible to prevent a large amount of the energizing current I from flowing to the normal conductive spot 15 that has locally transferred to the normal conductive state, and it is also possible to prevent the occurrence of thermal runaway or quench.

Figure 6:
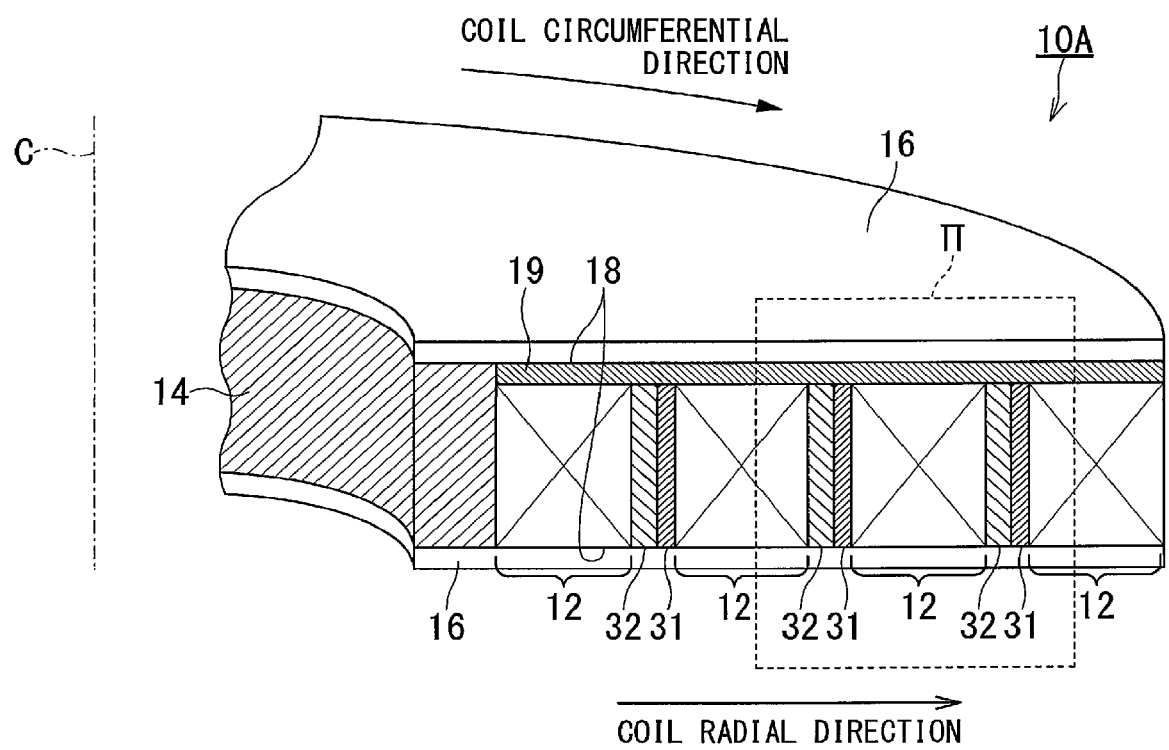
FIG. 6 is a cross-sectional view in the coil radial direction for illustrating the superconducting coil according to the second modification of the first embodiment.
Figure 7:
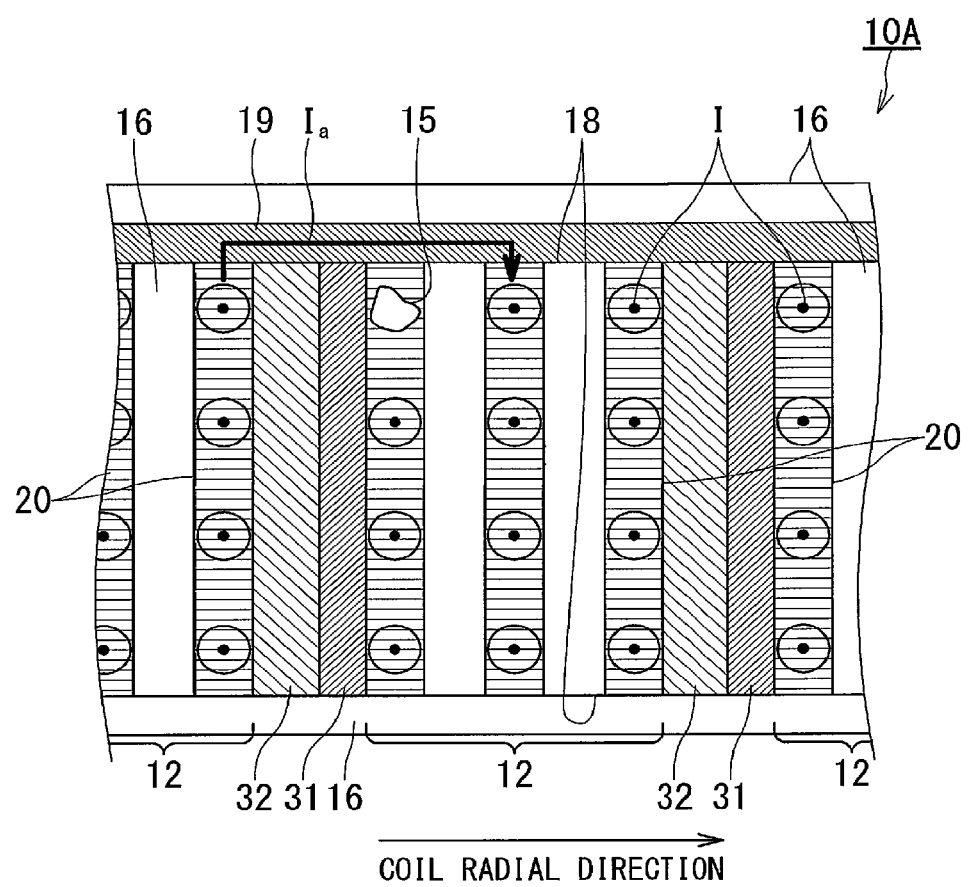
FIG. 7 is an enlarged cross-sectional view illustrating the Π portion of FIG. 6.

FIG. 6 is a cross-sectional view in the coil radial direction for illustrating the superconducting coil 10A according to the second modification of the first embodiment, and FIG. 7 is an enlarged cross-sectional view illustrating the II portion of FIG. 6.

As shown in FIG. 6 and FIG. 7, in the superconducting wire 10A, a release agent 31 is applied in a specific wire gap of the thin-film wire 20 in some cases so that the positional area of the release agent 31 is lower in adhesive strength than other wire gap portions.

Since the thin-film wire 20 is formed by laminating the plural layers 21 to 26 as described above, the thin-film wire 20 is vulnerable to the tensile stress, i.e., peeling stress in the direction perpendicular to the tape surface.

While the superconducting coil 10A is in use, however, the peeling stress is applied on the coil 10A. The peeling stress includes electromagnetic stress generated by excitation and thermal stress in the coil radial direction generated at the time of cooling down the superconducting coil 10A to operation temperature.

Thus, when the thin-film wire 20 is used for the superconducting coil 10A, it is required to take measures such that the peeling stress does not exceed the permissible value.

By using the release agent 31 for dividing the wire member 12 into plural sections in accordance with the peeling stress, the peeling stress is reduced.

However, in order to suppress the occurrence of thermal runaway or quench as described above, in some cases, a conductive material such as the normal conductive metal 32 is placed in the wire gap between turns of the thin-film wire 20 so as to be adjacent to the release agent 31 as shown in FIG. 5.

At a portion where the release agent 31 causes the normal conductive metal to become non-adherent, even when normal conductive transition occurs near this portion, the energizing current I cannot be allowed to sufficiently flow out across it.

For this reason, as shown in FIG. 6 and FIG. 7, the discharge path of the energizing current I is secured by connecting turns of the thin-film wire 20, which are unconnected by the release agent 31, with the use of the bypass 19.

Even when the normal conductive spot 15 is generated at a portion where the release agent 31 is non-adhered, the occurrence of thermal runaway or quench can be suppressed by the bypass 19.

Even in the case of providing the bypass 19 composed of a normal conductor, the energizing current I does not bypass the bypass 19 after the energizing current I completely falls in the steady state.

This is because the bypass 19 has a finite electrical resistance and the electrical the resistance and the inductance of the thin-film wire 20 are almost zero when the energizing current I is in the steady state.

In the case of excitation from the non-energized state to the rated current value, induced voltage is generated by the inductance that is caused by the change of the energizing current I.

A potential difference from adjacent another turn of the thin-film wire 20 is generated due to the induced voltage, and an electric current flows through the bypass 19 such that this electric current value becomes a value obtained by dividing this induced voltage by the electrical resistance value of the bypass 19.

This bypass current $I_a$, which increases with the amount of the bypass 19, slows down the formation of the expected magnetic field shape as described above.

In addition, heat is generated in the bypass 19 to make the superconductivity of the superconducting coil 10A unstable.

For this reason, as to the position of the bypass 19, it is desirable to provide the bypass 19 only on a part of the side surfaces 18 of the superconducting coil 10B (10).

Next, a description will be given of the position of the bypass 19 in detail by referring to FIG. 8 and FIG. 9.

Figure 8:
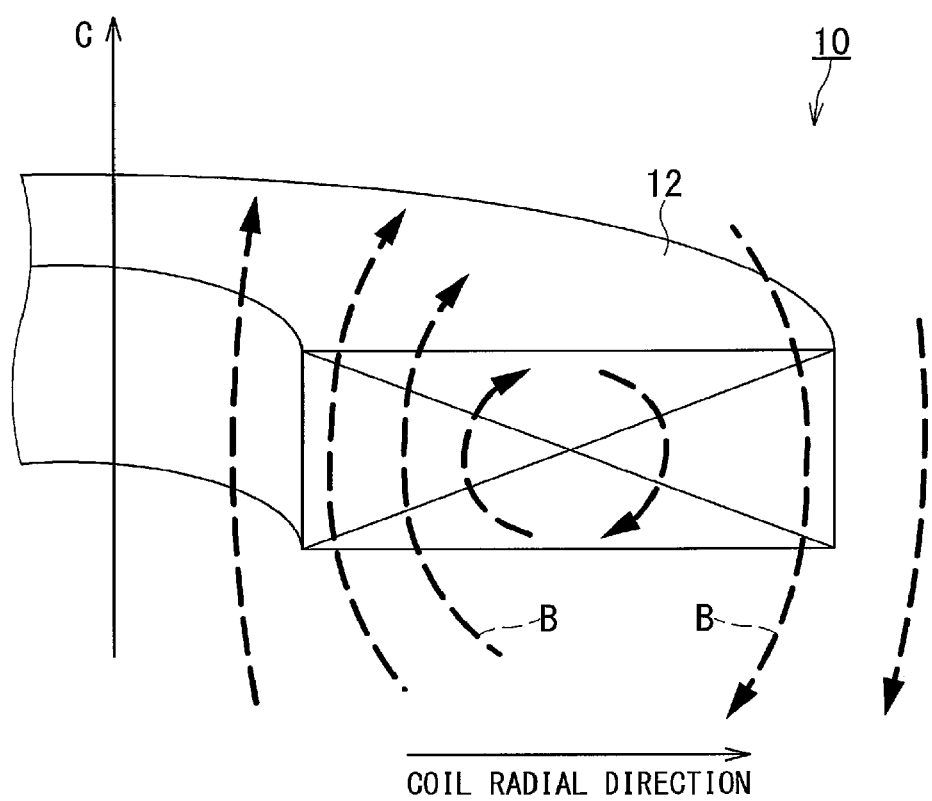
FIG. 8 is a schematic diagram illustrating a magnetic field shape based on an energizing current that acts on the superconducting coil of the first embodiment.

FIG. 8 is a diagram illustrating the shape of the magnetic field acting on the superconducting coil 10 (10A, 10B).

The magnetic field B based on the energizing current I turns from the winding center C of the superconducting coil 10 in the coil radial direction, and partly enters the thin-film wire 20 as shown in FIG. 8.

The magnitude of the flux flow resistance at each position in the thin-film wire 20 varies depending on the direction and the intensity of the magnetic field B passing through each position.

Figure 9:
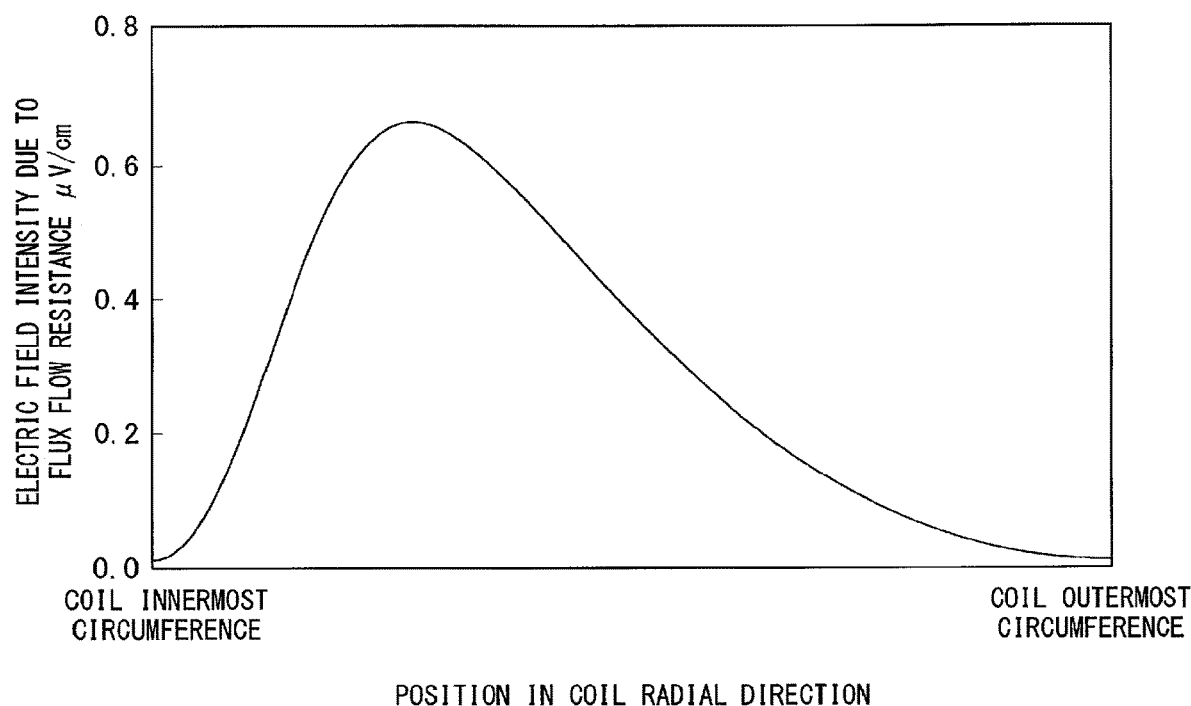
FIG. 9 is a diagram illustrating relationship between electric field intensity due to flux flow resistance and the position on the cross-section along the coil radial direction from the innermost circumference to the outermost circumference of the superconducting coil.

FIG. 9 is a diagram illustrating relationship between electric field intensity due to the flux flow resistance and the position on the cross-section along the coil radial direction from the innermost circumference to the outermost circumference of the superconducting coil 10A.

As is clear from FIG. 9, the maximum electric field intensity due to the flux flow resistance appears in the region from the innermost circumference to the central portion in the coil radial direction of the superconducting coil 10A.

In other words, at the positions from the innermost circumference to the central portion of the superconducting coil 10A, the critical current value $I_c$ is generally lower than the other positions.

Figure 10:
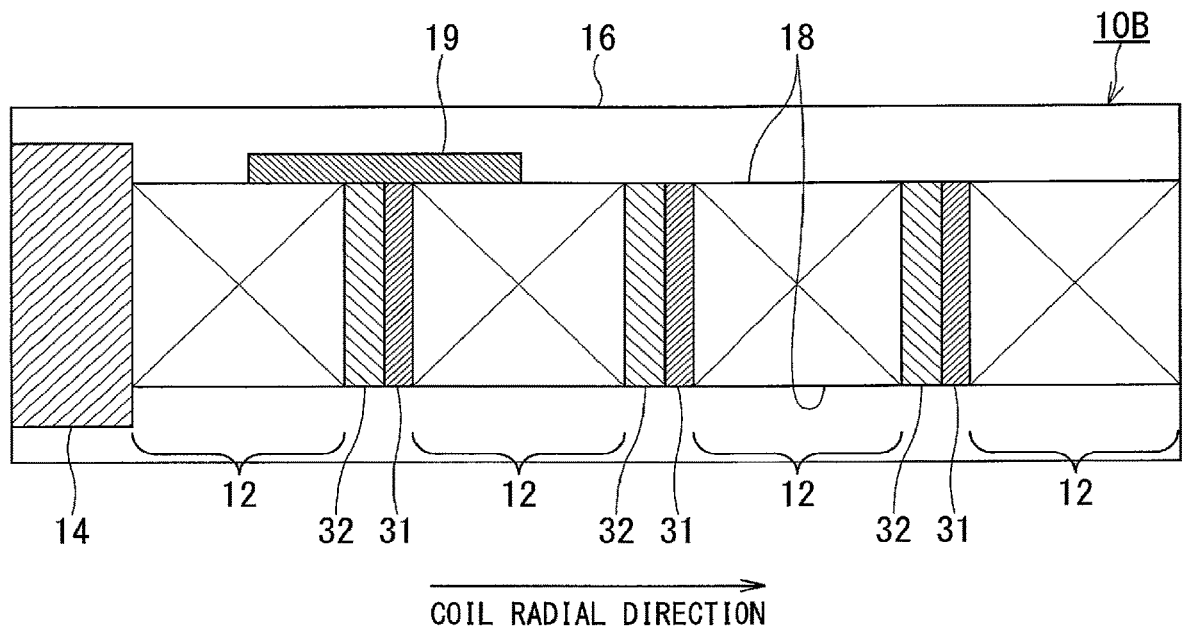
FIG. 10 is an enlarged cross-sectional view in the coil radial direction for illustrating a position of a bypass on the superconducting coil according to the second modification of the first embodiment.

FIG. 10 is an enlarged cross-sectional view in the coil radial direction for illustrating the superconducting coil 10 according to the second modification of the first embodiment. As shown in FIG. 10, the portion of the side surfaces 18 to be provided with the bypass 19 is desirably located in the region from the innermost circumference to the vicinity of the central portion of the superconducting coil 10B.

In other words, the bypass 19 is preferably located at a position having a high flux flow resistance, which lowers the critical current value $I_c$ in the superconducting coil 10B.

Figure 11:
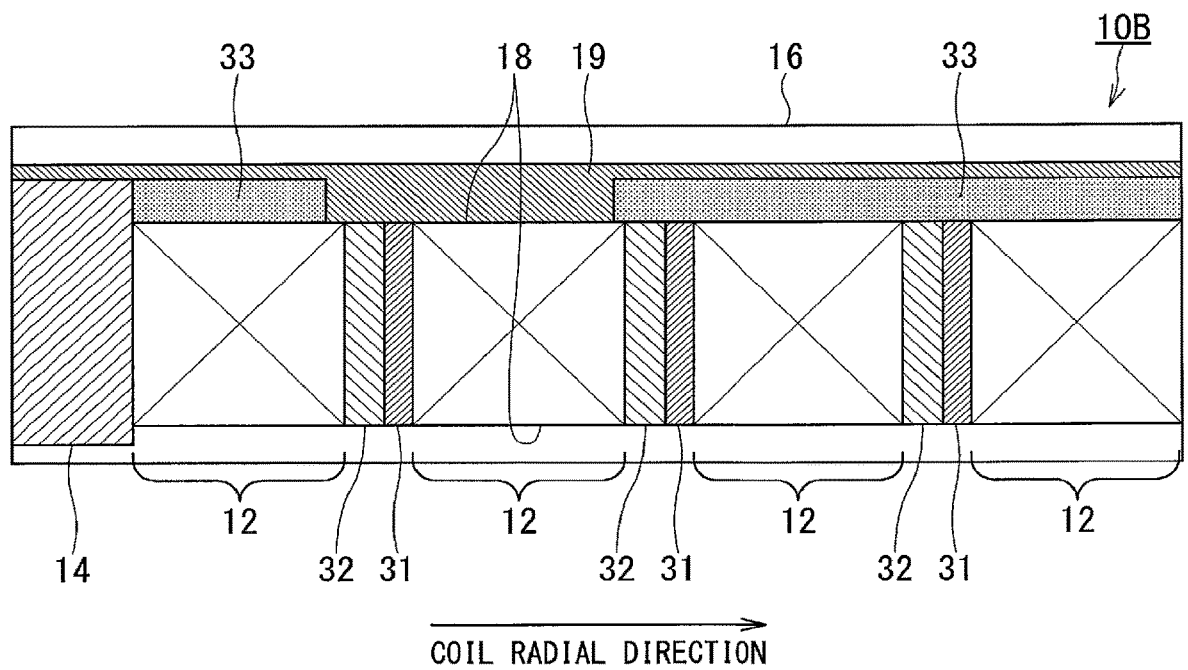
FIG. 11 is an enlarged cross-sectional view in the coil radial direction for illustrating an exemplary position of the bypass on the superconducting coil according to the third modification of the first embodiment.

FIG. 11 is an enlarged cross-sectional view in the coil radial direction for illustrating an exemplary position of the bypass 19 in the superconducting coil 10 according to the third modification of the first embodiment.

As shown in FIG. 11, the position of the bypass 19 may be limited by applying a masking material 33 such as tape or spray to the wire member 12.

The shape of the magnetic field B in FIG. 8 exemplifies a typical shape, and the shape of the magnetic field B varies depending on the shape of the superconducting coil 10B or the environment where it is disposed.

Thus, the specific position at which the bypass 19 is disposed is appropriately determined depending on the shape of the actual magnetic field B and the like.

According to the superconducting coil 10A of the first embodiment as described above, since it is possible to cause the energizing current I to bypass the normal conductive spot 15, the occurrence of thermal runaway or quench can be suppressed.

In addition, by combining the release agent 31 and the bypass 19, it is possible to reduce the peeling stress generated inside the superconducting coil 10B and to suppress the occurrence of thermal runaway or quench.

Second Embodiment

Figure 12:
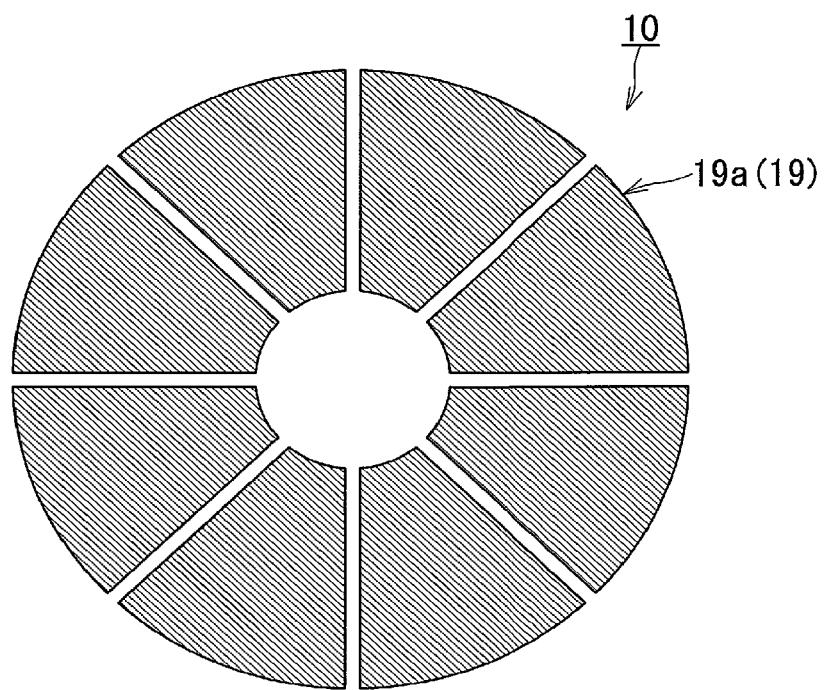
FIG. 12 is a top view of a bypass provided in the superconducting coil according to the second embodiment.

FIG. 12 is a top view of the bypass 19 provided in the superconducting coil 10 according to the second embodiment.

In the superconducting coil 10 according to the second embodiment, the bypass 19a (19) in disk shape is radially divided into plural sections in the coil radial direction and the plural sections of the bypass 19a are substantially concentrically positioned along the coil circumferential direction as shown in FIG. 12.

At the start of excitation by the superconducting coil 10, the magnetic field B based on the energizing current I fluctuates.

This fluctuation of the magnetic field B generates an eddy current in the bypass 19a.

Since the eddy current flows in such a direction that the energizing current I is reduced and thereby generation of the magnetic field B is suppressed, the generation of the eddy current is not preferable.

For this reason, the bypass 19a is cut in the coil radial direction to be divided into plural sections, and the plural sections of the divided bypass 19a are arranged along the coil circumferential direction so as to subdivide the circulation path of the eddy current.

Eddy current loss can be suppressed by subdividing the circulation path of the eddy current in the bypass 19a.

In addition, it is possible to suppress the occurrence of thermal runaway or quench that is caused by heat generation due to the eddy current.

Since the second embodiment is the same as the first embodiment in terms of configuration and operation except that the path of the eddy current is subdivided by dividing the bypass 19a, duplicate description is omitted.

The same reference signs are given for identical components in terms of configuration or function in each figure, and duplicate description is omitted.

According to the superconducting coil 10 of the second embodiment as described above, it is possible to obtain the effect of suppressing the occurrence of the eddy current generated in the bypass 19a at the start of excitation, in addition to the effects of the first embodiment.

In other words, superconducting coil 10 of the second embodiment makes it possible to prevent the decrease of the magnetic field B due to eddy current loss and to prevent the occurrence of thermal runaway or quench that is caused by heat generation due to the eddy current at the start of excitation.

Third Embodiment

Figure 13:
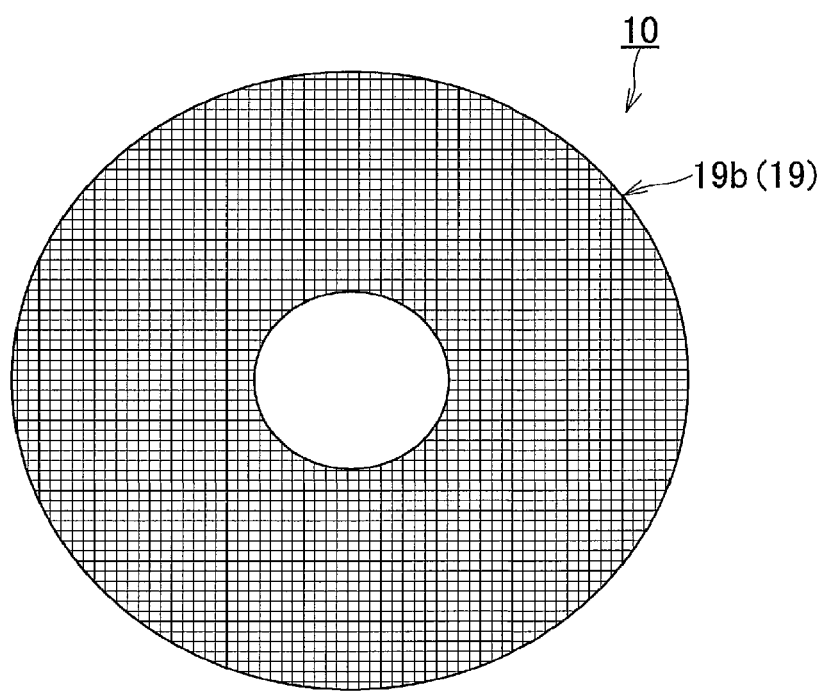
FIG. 13 is a top view of a bypass provided in the superconducting coil according to the third embodiment.

FIG. 13 is a top view of the bypass 19b(19) provided in the superconducting coil 10 according to the third embodiment.

In the superconducting coil 10 according to the third embodiment as shown in FIG. 13, a disk-shaped bypass 19b is provided with gaps or holes for adjusting the contact area with the side surfaces 18.

The optimum conductivity of the bypass 19b varies depending on the properties or the applications of the superconducting coil 10 to which the bypass 19b is applied.

Thus, it is preferable that the conductivity of the bypass 19b can be freely changed in accordance with each superconducting coil 10.

The outer shape and the material of the bypass 19b such as thickness, however, have some limits in their ranges in terms of, e.g., strength and volume.

For this reason, by providing the gaps or holes in the bypass 19b for adjusting the contact area with the side surfaces 18 of the wire member 12, the conductivity of the bypass 19b is freely adjusted without changing the outer shape and the material of the superconducting coil 10.

The gaps or holes of the bypass 19b may be formed by piercing a flat plate of a conductor to form numerous holes or by knitting a conductive wire material, for example.

In addition, existing products having gaps or holes such as a mesh material, a punching material, a filament material, a nonwoven fabric, a felt, wool, or a slit material may be used as the bypass 19b.

Further, these conductors may be used in combination if necessary at the time of manufacturing the wire member 12 or may be combined with the bypass 19b, which does not have the voids shown in the first embodiment, to adjust the conductivity.

As a material of the bypass 19b, conductors such as metal, ceramic, semiconductor, or conductive plastic may be preferably chose.

In addition, carbon materials such as graphite, a carbon fiber, or a carbon fiber composite material can also be preferably used as the bypass 19b.

Since the third embodiment is the same as the first embodiment in terms of configuration and operation except that the bypass 19b is provided with gaps or holes, duplicate description is omitted.

The same reference signs are given for identical components in terms of configuration or function in each figure, and duplicate description is omitted.

According to the superconducting coil 10 of the third embodiment as described above, conductivity can be adjusted by adjusting the ratio of the gaps or holes and thereby adjusting the contact area between the bypass 19b and the side surface 18, in addition to that the effects of the first embodiment are obtained.

In other words, the conductivity of the bypass 19b can be optimized without changing the outer shape such as the thickness of the bypass 19b.

Fourth Embodiment

Figure 14:
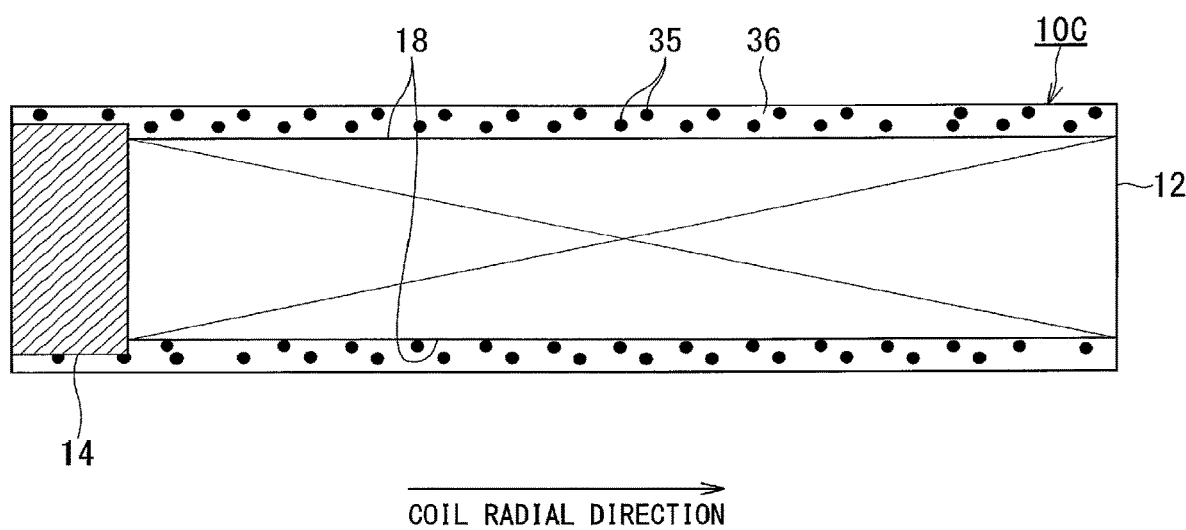
FIG. 14 is an enlarged cross-sectional view in the coil radial direction for illustrating the superconducting coil according to the fourth embodiment.

FIG. 14 is an enlarged cross-sectional view taken along the line II-II in FIG. 2 for illustrating the superconducting coil 10C (10) according to the fourth embodiment.

In the superconducting coil 10C according to the fourth embodiment, as shown in FIG. 14, the side surfaces 18 of the wire member 12 are coated with conductive resin 36 that contains conductive powder 35 in the insulating material 16.

For instance, the conductive powder 35 made of carbon-based powder such as carbon black, carbon fiber, or graphite forms the bypass 19.

For the conductive powder 35 forming the bypass 19, metallic powder such as metal fine particles, metal oxide, metal fiber, or whisker may be used.

The conductive powder 35 may be also obtained by metal-coating of fine particles or synthetic fibers.

As described above, in recent years, the normal conductive metal is sometimes put in the wire gap in order to induce the energizing current I to traverse other turns of the thin-film wire 20 when the normal conductive spot 15 is generated.

By using the conductive resin 36 containing the conductive powder 35 as the insulating material 16 and impregnating the wire member 12 with the conductive resin 36, it is also possible to fill the wire gap with a conductive material at the same time.

The wire gap and the coating of the side surfaces 18 may be separately formed to have different conductivities, and they may be formed in combination with the bypass described in the first embodiment, for instance.

Since the fourth embodiment is the same as the first embodiment in terms of configuration and operation except that the conductive powder 35 contained in the insulating material 16 becomes the bypass 19, duplicate description is omitted.

The same reference signs are given for identical components in terms of configuration or function in each figure, and duplicate description is omitted.

According to the superconducting coil 10C of the fourth embodiment as described above, since the independent bypass from the insulating material 16 is not needed, the bypass 19 can be formed without undesirably increasing the thickness of the superconducting coil 10C in addition to the effects of the first embodiment.

Further, by adjusting the mixing amount of the conductive powder 35, the conductivity can be easily changed.

Fifth Embodiment

Figure 15:
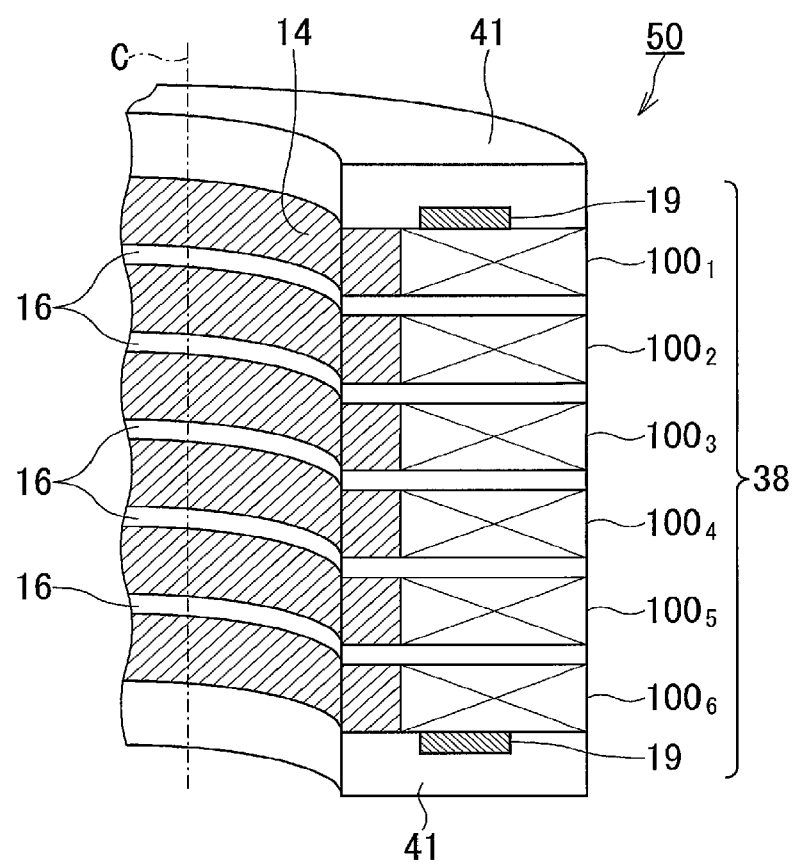
FIG. 15 is a partial cross-sectional perspective view illustrating the first form of the superconducting coil device.

FIG. 15 is a partial cross-sectional perspective view illustrating the first exemplary superconducting coil device 50.

In the superconducting coil device 50 according to the fifth embodiment, plural coils $100_n$ including the superconducting coil 10A in the first to fourth embodiments are stacked along the winding center C as shown in FIG. 15.

In the stacked body 38 of the coils $100_n$, there are provided components necessary for a magnetic-field generation source such as flanges 41 so that the superconducting coil device 50 is constituted.

Although normal conductive coils may be included in the stacked coils $100_n$, in the following description, it is assumed that every coil $100_n$ is a superconducting coil.

As described above, the intensity and the direction of the magnetic field B generated by the energizing current I varies depending on each position.

Figure 16:
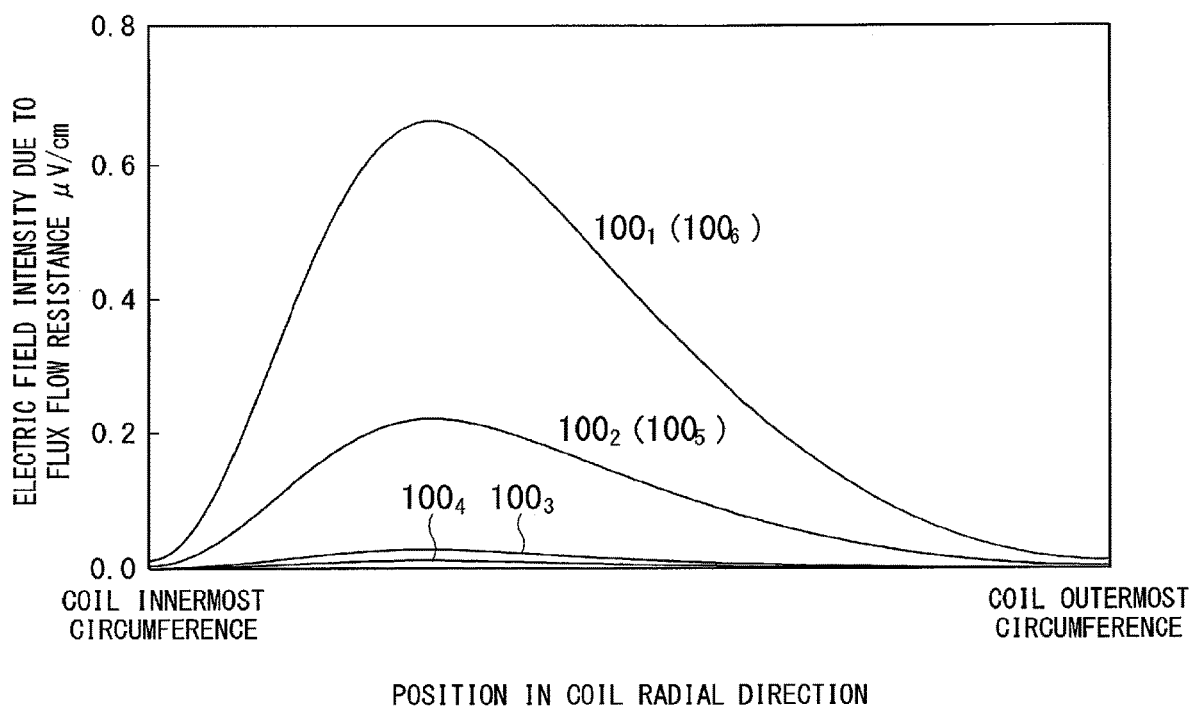
FIG. 16 is a diagram illustrating distribution of a vertical component of a magnetic field in each coil that constitutes the superconducting coil device.

FIG. 16 is a diagram illustrating the distribution of the vertical component of the electric field intensity due to the flux flow resistance that is caused by the magnetic field B in each coil $100_n$ (e.g., n=1 to 6).

It can be seen from FIG. 16 that the component of the magnetic field B perpendicular to the tape surface becomes smaller and the influence of the shielding current becomes smaller as the position of the coil $100_n$ to get stacked closer to the center portion in the winding center direction.

Thus, in the superconducting coil device 50, the thin-film wire 20 provided with the bypass 19 is preferably used for the coil in the vicinity of the end portion along the winding center C, such as the coil $100_1$ ($100_6$).

When there are plural pairs of coils $100_n$ connected by coil-to-coil paths 37, the respective coil-to-coil paths 37 may be different in conductivity from each other to adjust the flow rate of the detouring energizing current I.

Accordingly, also in the stacked body 38 of the plural coils $100_n$ stacked along the winding center C, the magnitude of the flux flow resistance based on the magnetic field B differs depending on the position of the coil $100_n$.

In other words, the critical current value $I_c$ of the coil $100_n$ is different depending on the stacked position of the coil $100_n$ in the stacked body 38.

Specifically, in general, the critical current value $I_c$ is lowered at the coils $100_n$ at both ends of the stacked body 38 where the component of the magnetic field B in the separation direction (i.e., in the coil radial direction) is maximized.

For this reason, the superconducting coils 10 shown in the first to fourth embodiments are at both ends of the stacked body 38.

As described above, when the bypass 19 is excessively used, the energizing current I bypassing the bypass 19 at the start of excitation becomes excessive and it takes time to reach the assumed magnetic field shape.

Hence, it is desirable to apply the superconducting coil 10 provided with the bypass 19 only at a position where the critical current value $I_c$ is particularly low, such as both ends of the stacked body 38.

Since the fifth embodiment is the same as the first embodiment in terms of configuration and operation except that the superconducting coil 10 is specifically applied to the superconducting coil device 50 and the arrangement position of the superconducting coil 10 is specified, duplicate description is omitted.

The same reference signs are given for identical components in terms of configuration or function in each figure, and duplicate description is omitted.

As described above, according to the superconducting coil device 50 of the fifth embodiment, the same effects as those of the first embodiment and the like can be obtained.

In addition, the superconducting coil 10 equipped with the bypass 19 only at a specific position in the stacked body 38 prevents the excitation time for the formation of the magnetic field to be the assumed shape from becoming longer.

Sixth Embodiment

Figure 17:
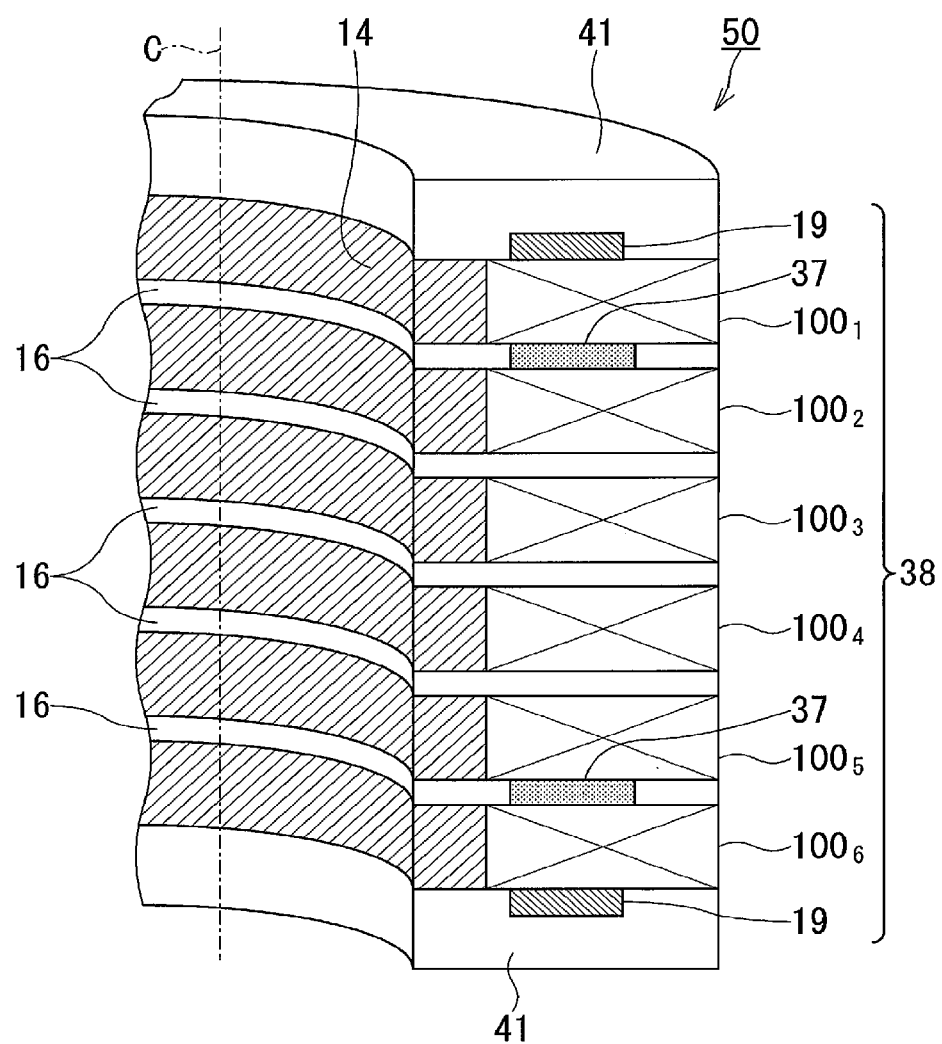
FIG. 17 is a partial cross-sectional view illustrating second form of superconducting coil device.

FIG. 17 is a partial cross-sectional view illustrating another exemplary superconducting coil device.

As shown in FIG. 17, the superconducting coil 10 according to the sixth embodiment includes the coil-to-coil paths 37 that are electrically connected to another coil $100_n$ stacked in adjacent.

Each bypass 19 is for diverting the energizing current I to another specific turn in the same wire member 12.

However, for instance, when most of the specific coils $100_n$ are in the normal conductive transition, it is preferable to divert the energizing current I to other adjacent coils $100_n$.

Accordingly, the coil-to-coil paths 37 provided in the side surfaces 18 of the specific superconducting coils 10 are electrically connected to other adjacent coils $100_n$.

By connecting the coil-to-coil paths 37 to the other coils $100_n$, it is possible to cause the energizing current I to detour to another coil $100_n$ in the case where the normal conductive transition has progressed.

As in the case of the first embodiment, the coil-to-coil paths 37 connected to the other coil $100_n$ are preferably provided to only a few coils $100_n$ ($100_1$, $100_6$) positioned where the magnetic field B intrudes strongly and the critical current value $I_c$ becomes small.

In addition, it is desirable that the coil-to-coil paths 37 are lower in conductivity than the bypass 19.

In order to obtain an assumed magnetic field shape as quickly as possible, it is preferable that the energizing current I detours only in one superconducting coil 10 as much as possible.

According to the superconducting coil 10 (100) of the sixth embodiment as described above, it is possible to suppress the occurrence of thermal runaway or quench by causing the energizing current I to cross from a coil $100_n$ subjected to the normal conductive transition to another adjacent coil, in addition to that the effects of the first embodiment are obtained.

As to the coil $100_n$ at a position where it is assumed that the critical current value $I_c$ is high, the occurrence of thermal runaway or quench can be suppressed even when some kind of abnormality causes unexpected resistance.

According to the superconducting coil 10A and the superconducting coil device 50 of at least one embodiment described above, it is possible to suppress the occurrence of thermal runaway or quench by causing the energizing current I to bypass the normal conductive spot 15.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and the spirit of the inventions.

For instance, in FIG. 2, the so-called pancake-shaped superconducting coil 10 is illustrated as the shape of the wire member 12 provided with the bypass 19.

However, the applicable wire member 12 is not limited to pancake-shaped ones.

Figure 18A:
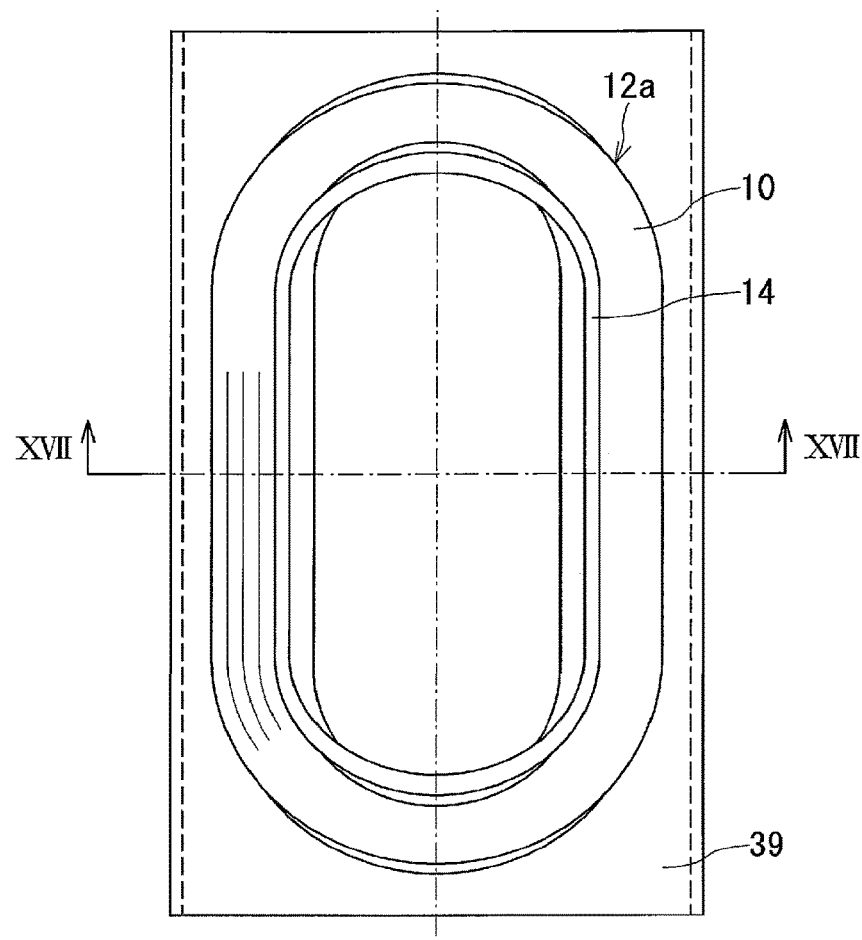
FIG. 18A is a top view of a saddle-shaped winding member.
Figure 18B:
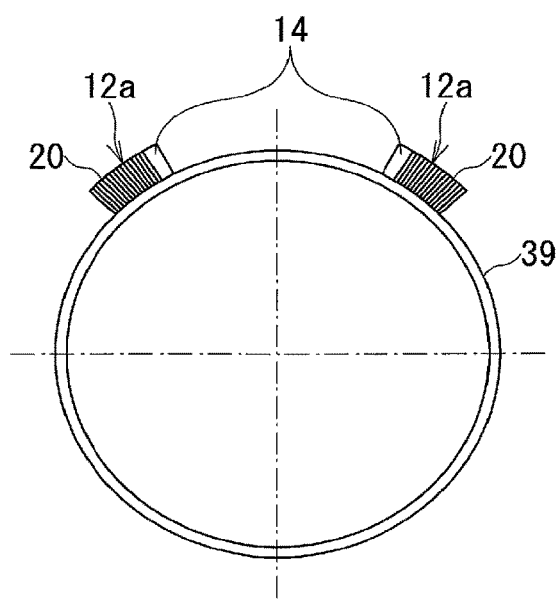
FIG. 18B is a cross-sectional view taken along the line XVII-XVII of the winding member in FIG. 18A.

For instance, FIG. 18A illustrates a race-track-type winding frame 14 installed on a circular curved surface 39 and the wire member 12a of the thin-film wire 20. FIG. 18B is a cross-sectional view taken along the line XVII-XVII in FIG. 18A.

For instance, as shown in FIG. 18A and FIG. 18B, it can also be applied to the saddle-shaped wire member 12a placed on the curved surface 39 together with the distorted winding frame 14.

Figure 19:
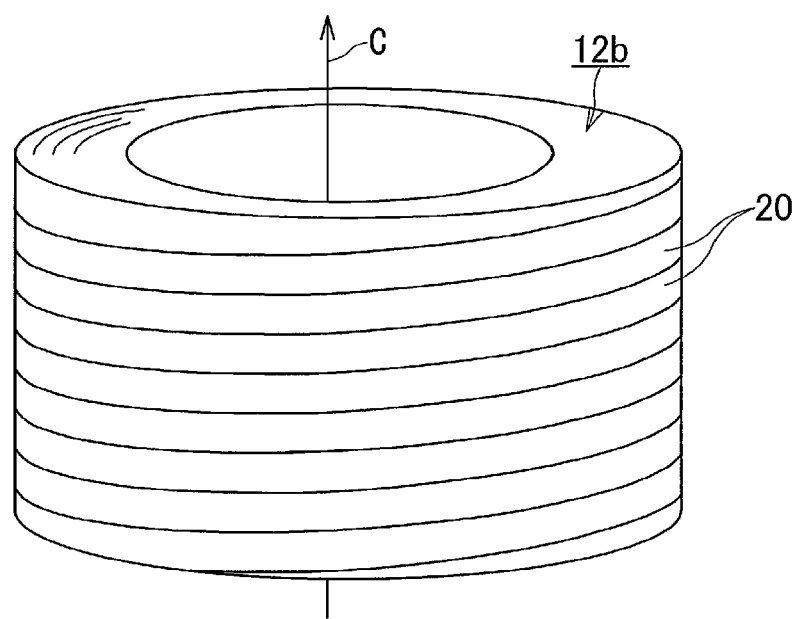
FIG. 19 is a diagram illustrating a solenoid-type winding member.

In addition, the bypass 19 can also be applied to a non-circularly wound race-track type, a saddle type, an elliptical shape, or the solenoid type wire member 12b shown in FIG. 19.

REFERENCE SIGNS LIST 10 (10A to 10C) superconducting coil
12 (12a, 12b) winding member
14 winding frame
15 normal conductive spot
16 insulating material
18 side surface
19 (19a, 19b) bypass
20 high-temperature superconducting wire (thin-film wire)
21 stabilizing layer
22 substrate
23 orientation layer
24 intermediate layer
25 high-temperature superconducting layer (superconducting layer)
26 protective layer
31 release agent
32 normal conductive metal
33 masking material
34 flat plate
35 conductive powder
36 conductive resin
37 coil-to-coil path
38 stacked body
39 curved surface
41 flange
50 superconducting coil device
$100_n$ (100) coil (superconducting coil)
B magnetic field
C winding center
I energizing current
$I_a$ detouring current
$I_c$ critical current value
$R_a$ resistance of bypass
R flux flow resistance

The invention claimed is:

1. A superconducting device comprising a plurality of superconducting coils, each superconducting coil comprising:
   a winding member including a side surface along a coil radial direction, and formed by laminating a superconducting tape wire in the coil radial direction by winding; and
   a bypass provided on the side surface and in a wire gap of the winding member and electrically connecting the superconducting tape wire in the coil radial direction,
   wherein the bypass comprises resin and conductive powder containing at least one of: carbon black; carbon fiber; graphite; metal oxides; metal-coated fine particles; and metal-coated synthetic fibers,
   wherein the bypass is formed of a material having a resistance that is larger than the resistance of the superconducting tape wire during normal operation and smaller than the resistance of the superconducting wire at a time of normal conduction transition.

2. The superconducting device according to claim 1, further comprising:
   a release agent weakening adhesive force provided between adjacent surfaces of the superconducting tape wire, the adjacent surfaces facing each other by the winding; and
   wherein the bypass is configured to connect turns of the superconducting tape wire to each other, the turns of the superconducting tape wire facing each other with the release agent interposed between the turns of the superconducting tape wire.

3. The superconducting device according to claim 1,
wherein the bypass is composed of a normal conductor, a semiconductor, a ceramic material, or a superconducting material.

4. The superconducting device according to claim 1,
wherein the bypass includes a gap or a hole that adjusts a contact area with the side surface of the winding member.

5. The superconducting device according to claim 1,
wherein the bypass is formed by plating or coating.

6. The superconducting device according to claim 1,
wherein the side surface of the winding member is coated with conductive resin containing conductive powder; and
the bypass is formed of the conductive powder.

7. The superconducting device according to claim 1,
wherein the superconducting tape wire is a high-temperature superconducting tape wire.

8. The superconducting device according to claim 1,
wherein the plurality of coils including the superconducting coil are stacked along a winding center.

9. The superconducting device according to claim 8,
wherein the superconducting coil is disposed at a position where a critical current value is low compared with other stacked coils.

10. The superconducting device according to claim 8,
further comprising coil-to-coil paths that are stacked and electrically connected to another adjacent coil.

11. The superconducting device according to claim 10,
wherein the coil-to-coil paths are different in conductivity from each other depending on positions in a winding center direction.

12. The superconducting device according to claim 1,
wherein the bypass between the side surface and in the wire gap has different conductivities.

* * * * *